United States Patent [19]
Walsten et al.

[11] Patent Number: 6,137,285
[45] Date of Patent: Oct. 24, 2000

[54] ELECTRICAL VOLTAGE TESTER

[75] Inventors: Dean R. Walsten, Slinger; Thomas M. Luebke, Menomonee Falls; David L. Wiesemann, Pewaukee, all of Wis.

[73] Assignee: Applied Power, Inc., Milwaukee, Wis.

[21] Appl. No.: 09/200,880

[22] Filed: Nov. 30, 1998

[51] Int. Cl.[7] .......... G01R 19/14; G01R 31/02; G01R 1/38; G01R 1/06
[52] U.S. Cl. .......... 324/133; 324/72.5; 324/115; 324/149
[58] Field of Search .......... 324/133, 72.5, 324/149, 508, 511, 555, 556, 115; 374/121

[56] References Cited

U.S. PATENT DOCUMENTS

| | | | |
|---|---|---|---|
| 4,225,817 | 9/1980 | Kahlden | 324/133 |
| 4,259,635 | 3/1981 | Triplett | 324/149 |
| 4,825,150 | 4/1989 | Sirasud | 324/133 |
| 5,319,306 | 6/1994 | Schuyler | 324/133 |
| 5,543,707 | 8/1996 | Yoneyama et al. | 324/115 |
| 5,836,692 | 11/1998 | Pompei | 374/121 |

OTHER PUBLICATIONS

Applicant's Exhibit A—"GB® Instruments" Catalog #AD–423 of GB® Gardner Bender, dated 1997.

*Primary Examiner*—Safet Metjahic
*Assistant Examiner*—Anjan K Deb
*Attorney, Agent, or Firm*—Quarles & Brady LLP

[57] ABSTRACT

A voltage tester has an indicator housing and two separate probes connected to the housing by lead wires. One or more visual indicators are provided on the top surface of the indicator housing which wrap around to the sides and front of the indicator housing, and the bottom of the indicator housing has a clip into which the probe handles may be snapped from the sides of the clip so as to hold the probes beneath the indicator housing with the probe tips extending forward of the indicator housing and spaced a distance apart so as to fit into the blade openings of an ordinary wall outlet.

7 Claims, 4 Drawing Sheets

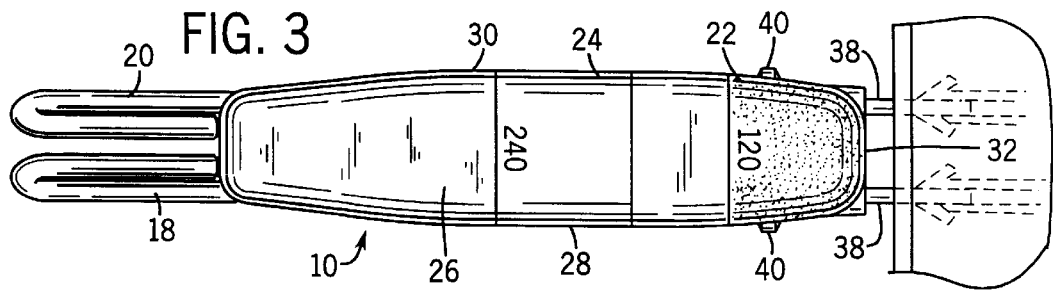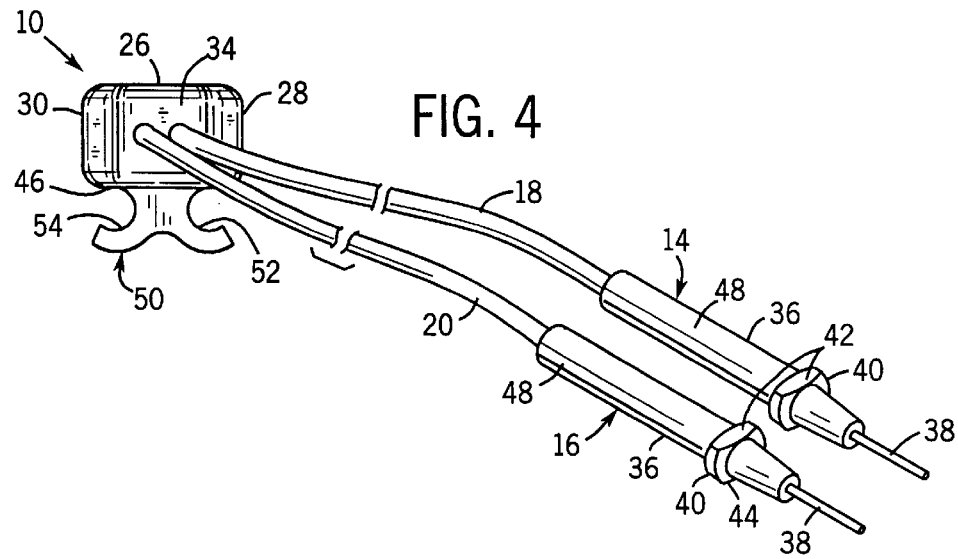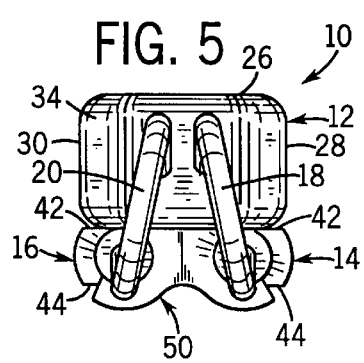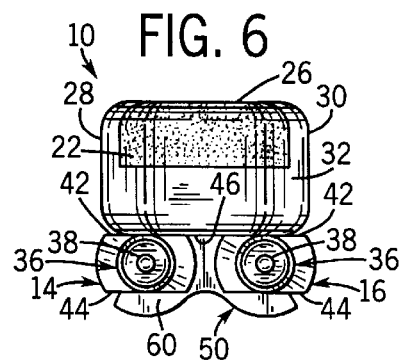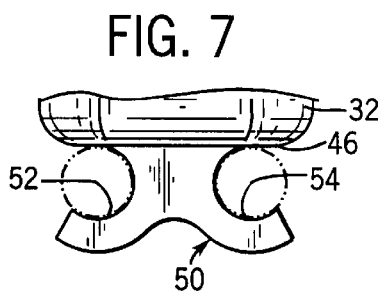

ELECTRICAL VOLTAGE TESTER

CROSS-REFERENCE TO RELATED APPLICATIONS

Not applicable.

STATEMENT REGARDING FEDERALLY SPONSORED RESEARCH OR DEVELOPMENT

Not applicable.

FIELD OF THE INVENTION

This invention relates to electrical voltage testers, particularly to such testers having an indicator housing and a pair of electrical contact probes, the probes being adapted to be insertable into a wall outlet to test for a voltage.

BACKGROUND OF THE INVENTION

Electrical voltage testers are well known, widely available, for example, in hardware stores, and in widespread usage by not only electricians but also the general public. A common usage of such testers is to test a wall outlet to see if the normal 110–120 volts exists across the two main nodes of the outlet. The tester may also be used to test for other voltages if it is so adapted, such as whether 240 volts is present at a 240 volt outlet, also commonly found in household and industrial buildings. The tester may also be used to determine voltages between any two points, at least voltages exceeding the voltage at which the indicator illuminates, which may be between a wire thought to be hot and ground, or any other two points between which a voltage is suspected.

These voltage indicators are typically used for a quick check to determine if a voltage is present. They are relatively inexpensive items, and because of their widespread usage they must be easy and convenient to use.

U.S. Pat. No. 4,259,635 discloses a combined continuity and voltage tester having a pair of probes spaced for insertion into an electrical wall socket. One of the probes is permanently affixed to the housing of the tester. The other probe is connected by a lead wire to the housing and can be removably attached to the housing so that it is parallel to and spaced from the other permanently connected probe so as to fit in a wall socket. The advantage of this tester is that wall sockets can be tested with one handed operation. The problem, however, is that only one of the probes has a lead wire attached to it and the other probe is permanently affixed to the housing, making the permanently affixed probe rather clumsy to handle when probing electrical nodes other than the nodes of a wall socket.

SUMMARY OF THE INVENTION

The invention provides an electrical voltage tester of the above described type, but in which each of the probes includes an insulated probe handle which separates from the indicator housing and is connected to the indicator housing by lead wires. A clip is integrally formed on the bottom surface of the indicator housing to removably hold the probe handles with the probe tips extending forward of the front end of the indicator housing parallel and spaced apart by a distance so as to fit into an electrical wall socket. A visual indicator is provided on the top surface of the indicator housing, opposite from the clip, for telling an operator when a live voltage of a certain magnitude is found. Thereby, the indicator can be used with either one handed operation to probe a wall outlet, or both probes can be removed from the indicator housing to probe nodes at any spacing and in tight spaces.

In a preferred aspect, the housing has a relatively large indicator area on its top surface which is readily visible from above the indicator and not easily obliterated by normal handling of the tester. The tester may be a single voltage tester, in which it has one indicator or maybe a dual voltage tester, in which one of the indicators lights up at a first voltage and both indicators light up at a voltage higher than the first voltage.

In another preferred aspect, the probes are snapped into the clip from sides of the housing, with the probe tips held parallel in front of and below the housing, spaced so as to probe a wall outlet with one-handed operation. Cylindrical handles of the probes are held by the clip on the bottom of the housing with a snap fit, and flats on flanges of the probe handles are held against the bottom of the housing to keep the probes from rotating out of the clip. The clip can also be used to attach the housing to a wire or other support when the probes are released from the clip and are used to probe nodes other than of a wall outlet.

These and other objects and advantages of the invention will be apparent from the detailed description and drawings.

BRIEF DESCRIPTION OF THE DRAWINGS

FIG. 3 is a top plan view from the plane of the line 3—3 of FIG. 2;

FIG. 4 is a front end plan view of the tester with the probes removed from the housing;

FIG. 5 is a rear plan view of the tester;

FIG. 6 is a front plan view of the tester;

FIG. 7 is a detail front view of a clip integrally formed on the bottom surface of the tester;

DETAILED DESCRIPTION OF THE PREFERRED EMBODIMENTS

FIGS. 1–9 illustrate a dual voltage voltage tester 10 of the invention having an indicator housing 12 and a pair of probes 14 and 16. The probes 14 and 16 are electrically connected to a circuit inside the housing 12 by a respective pair of lead wires 18 and 20.

Figure 9:
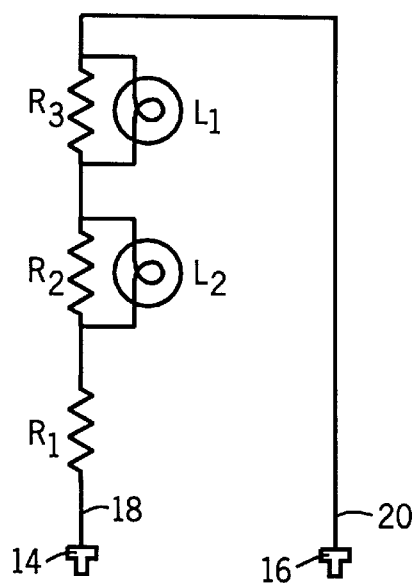
FIG. 9 is a schematic of an electrical circuit for the tester.
Figure 10:
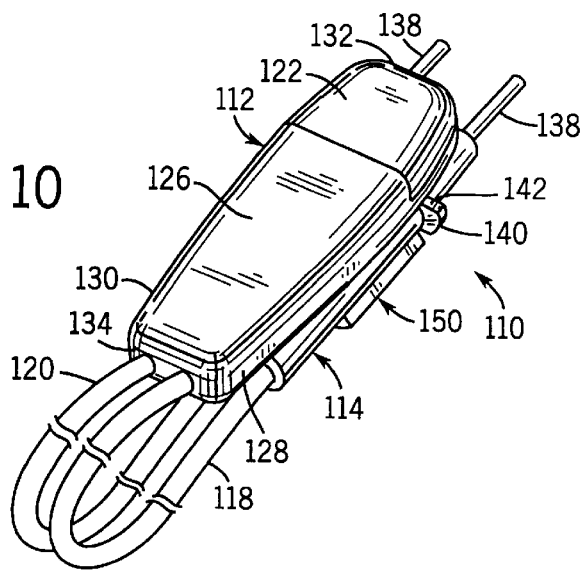
FIG. 10 is a perspective view of a second embodiment of a tester of the invention.
Figure 11:
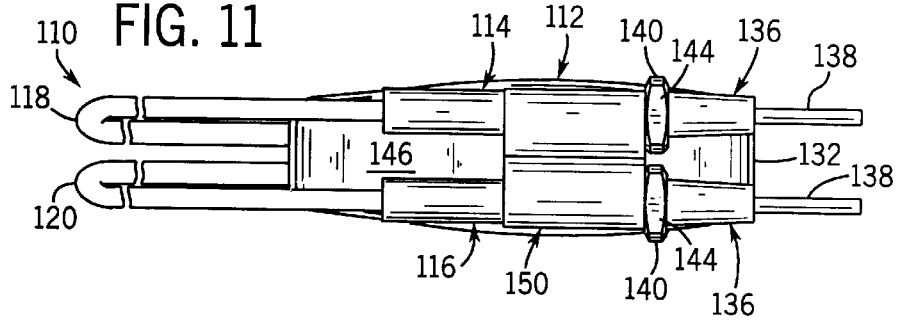
FIG. 11 is a bottom plan view of the tester of FIG. 10.
Figure 12:
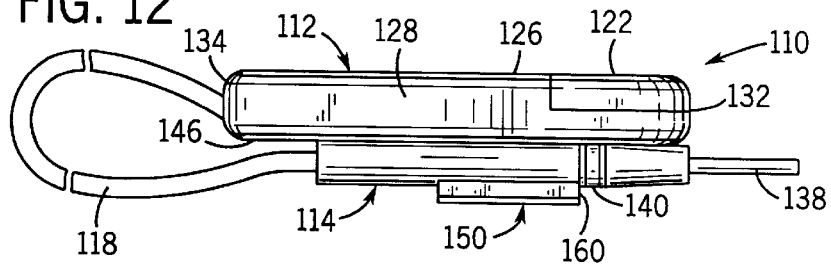
FIG. 12 is a side plan view of the tester of FIG. 10.

The circuit is illustrated in FIG. 9 and includes three resistors R1–R3 and two neon lamps, L1 and L2. R1 limits the current flow through the circuit. R2 is sized to cause L1 to light at a voltage at or above 100 volts between the probes 14 and 16. R3 is sized to cause lamp 2 to light at a voltage between the probes 14 and 16 at or exceeding 200 volts. Thus, at the normal household voltage of 110–120 volts, only L1 lights. At the less frequent but also common household voltage of 220–240 volts, both lamps L1 and L2 light.

The housing 12 is made of molded plastic and is hollow so as to contain the circuit of FIG. 9. The housing 12 is mostly opaque, but includes transparent or translucent lens panels 22 and 24. Lamp L1 is positioned on the circuit behind panel 22 and lamp L2 is positioned on the circuit behind panel 24. A wall (not shown) is preferably provided inside the housing 12 between the panels 22 and 24 so that light from lamp L1 does not light up panel 24 to any significant extent and light from lamp L2 does not light up panel 22 to any significant extent. Thus, lamp L1 shining through panel 22 provides a visible indicator which is visible by an operator from above the top surface 26 of the housing 12 when a voltage greater than 100 volts but less than 200 volts is applied between the probes 14 and 16, so long as lamp L2 is not also lit. The lamp L2 shining through the panel 24 provides a visible indication to a user from above the top surface 26 when a voltage greater than 200 volts is applied between the probes 14 and 16. With a voltage of this magnitude, both lamps L1 and L2 are lit.

Both panels 22 and 24 wrap around to the side surfaces 28 and 30 of the housing 12 so that light is emitted through the respective panels to the sides of the housing 12 and is visible to a user from the sides. Thus, even if a user is covering one or both of the panels 22 and 24 with his or her hand or finger, if that panel is illuminated, light will be visible from the sides of the housing 12. Panel 22 also wraps around and covers a portion of the front end 32 of the housing 12 so that light from lamp L1 will also be emitted through the front of the housing 12 and will therefore be visible from that surface.

Preferably, as illustrated, the insulated lead wires 18 and 20 enter the housing 12 through the rear surface 34. Each probe 14 and 16 includes a tubular probe housing 36 made of an insulating material, such as molded plastic, and the respective lead wires 18 and 20 enter the probe housing 36 from the rear end thereof and continue axially inside the housings 36 to the electrically conductive tips 38 of the respective probes 14 and 16. Lead wires 18 and 20 are in electrical contact with the respective tips 38.

Each housing 36 preferably includes a flange 40 with at least one flat side 42. In the embodiment illustrated, the flanges 40 also have a second flat side 44, although the flanges 42 could be made with only flat side 42 and the side 44 being rounded as a continuation of the round sides of the flange 40. The purpose of the flat surface 42 or 44 is to be held flat against the bottom surface 46 of the housing 12 to prevent the probes 14 and 16 from rotating relative to the housing 12.

The tubular handle portions 48 of the probe housings 36, which are behind the flanges 40, are snapped from the side of the housing 12 into a clip structure 50 which is integrally molded into bottom wall 46 of the housing 12. Clip structure 50 defines at it sides two generally half-round cylindrical and parallel recesses 52 and 54. The recesses 52 and 54 extend for slightly greater than 180 degrees as illustrated in FIG. 7 and are of approximately the same diameter as, or slightly smaller than, the handle portions 48 of the probe housings 36, so that they hold the handle portions with a releasable snap fit connection. Rotation out of the recesses 52 and 54 is prevented by the flats 42.

The portions of the housing 12 other than the lens panels 22 and 24 are opaque, including the clip structure 50. These portions are molded from a rigid but elastic plastic material that can flex sufficiently so as to permit the probes 14 and 16 to be readily snapped into and out of the openings 52 and 54, but to hold the probes 14 and 16 securely with the flat surfaces 42 against the bottom 46 of the housing 12. The flanges 40 abut the front surface 60 of the clip structure 50 to prevent rearward movement of the probes 14 and 16 relative to the clip structure 50. In that position, each probe housing extends forward a distance from the flange 40 so that it terminates at the forward end 32 of the housing 12, with the probe tips 38 extending forwardly from there.

Figure 1:
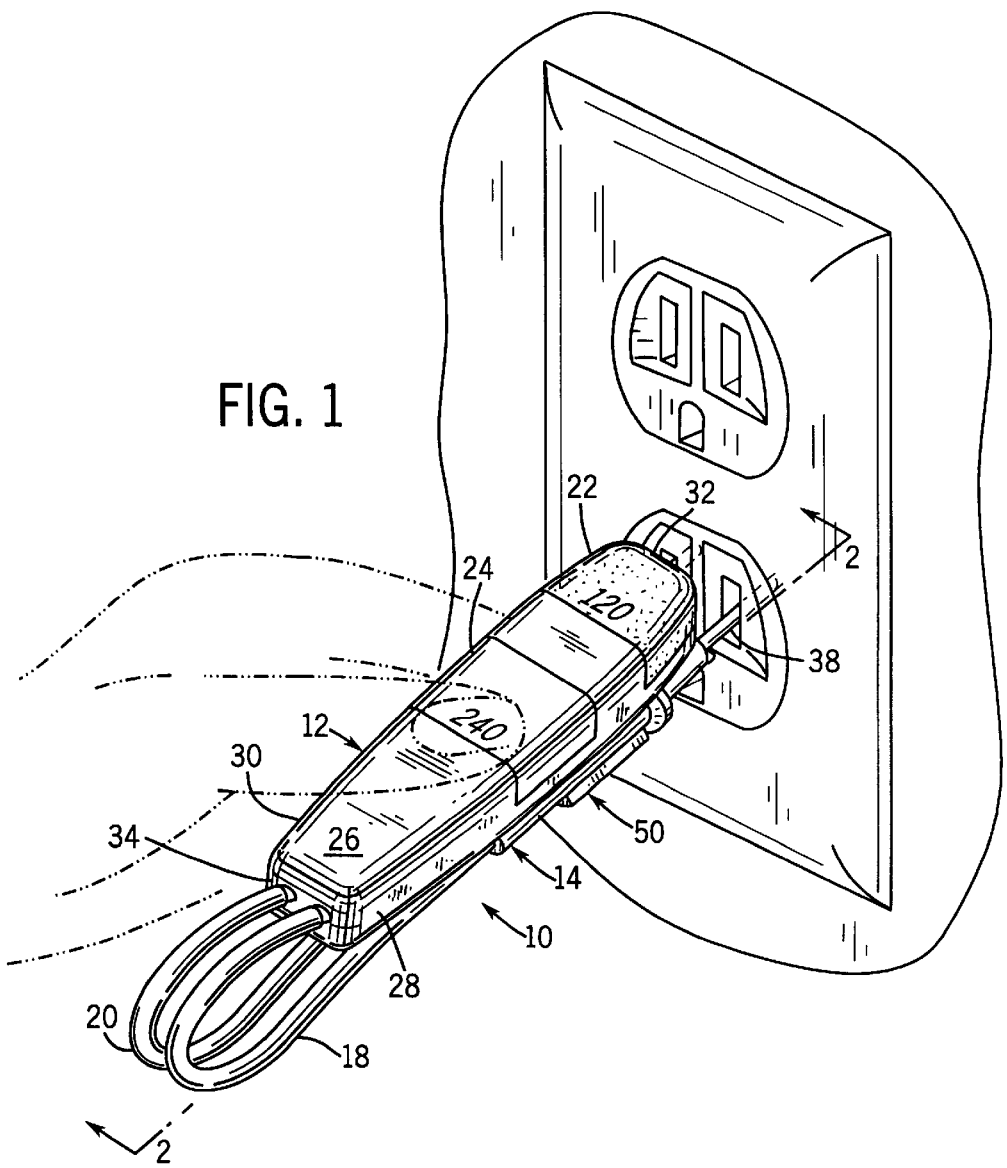
FIG. 1 is a perspective view of a dual voltage voltage tester of the invention probing a wall socket.
Figure 2:
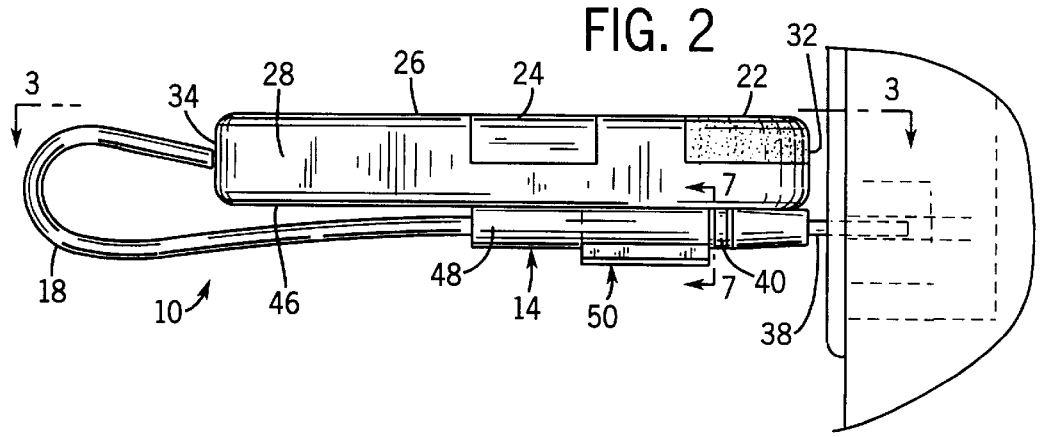
FIG. 2 is a side view of the indicator of FIG. 1.
Figure 8:
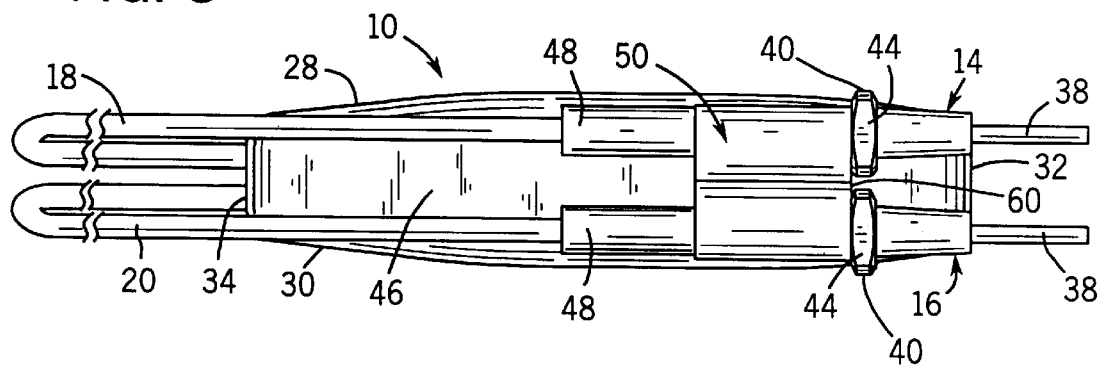
FIG. 8 is a bottom plan view of the tester.

The clip structure 50 holds the probes 14 and 16 parallel and spaced apart center to center by approximately ½ inch, which is the standard spacing of the socket openings of a common wall outlet into which the probe tips 38 are inserted as shown in FIG. 1. The flanges 40 also act as stops for a user when the user holds a handle portion 48 so that the user's hand does not slide forward past the flange 40, thereby preventing it from touching or getting too close to what may be a live voltage being probed by the probe tips 38.

FIG. 4 illustrates the tester 10 with the probes removed from the clips. With each probe housing 36 separate from the indicator housing 12, and the probes connected to the indicator housing 12 by wires 18 and 20, the probe tips 38 can be maneuvered into small and tight spaces to probe electrical node which are unreachable with the probes held by the housing. When doing this, the indicator housing 12 can be left to dangle from the leads 18 and 20, particularly since the indicator panels 22 and 24 are visible from many different angles, the housing 12 can be laid down, or the clip structure 50 can be used to clip the housing 12 to a wire or other object to hold the housing 12 while probes 14 and 16 are being used.

Referring to FIGS. 10–13, the invention can also be practiced with a single voltage voltage tester 110. In the voltage tester 110, elements corresponding to the elements of the tester 10 have been labeled with the same reference number plus 100.

Figure 13:
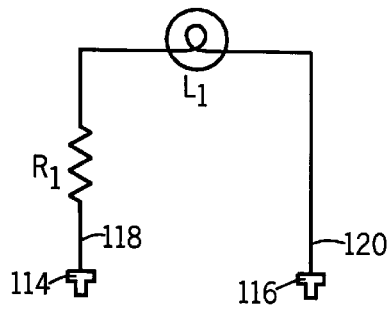
FIG. 13 is a schematic of an electrical circuit for the tester of FIG. 10.

The circuit for the voltage tester 110 is illustrated in FIG. 13. The probe s 114 and 116 are connected via respective leads 118 and 120 to the circuit, which includes a current limiting resister R1 which is sized so that lamp L1, which is a neon lamp, will light at approximately 60 volts. Thus, the lamp L1 will light in a voltage range of approximately 60 to 250 volts AC or DC. The housing 112 includes panel 122 which is visible from the top, sides and front of the housing 112, and also includes the clip 150 which is used to removably hold the probes 114 and 116 at a spacing so that they fit into the blade openings of a regular wall outlet, i.e. ½ inch, and can also be used to clip thief housing 112 to a wire or other item while the probes 114 and 116 are being used separately and independently of each other and independently of the housing 112.

Many modifications and variations to the preferred embodiment will be apparent to those skilled in the art. Therefore, the invention should not be limited to the embodiments described, but should be defined by the claims which follow.

We claim:

1. A voltage tester of the type having an indicator housing and two probes, said housing having a top surface, a bottom surface, a front end and rear end, and side surfaces connecting said top and bottom surfaces, and said housing having an electro-luminescent indicator visible by an operator from above said top surface, which indicator lights when said probes are touched against two nodes of a circuit between which a voltage exceeding a certain magnitude exists, each said probe including a cylindrical insulated probe handle, being connected to said indicator housing by a lead wire which exits said probe from the rear of said handle, and having at a front end of said handle a conductive probe tip in electrical contact with said lead wire, the improvement wherein:

a clip is formed integrally on said bottom surface of said indicator housing for removably holding both of said probe handles with said probe tips extending forward of said front end of said indicator housing, parallel and spaced apart by a certain distance to simultaneously be inserted into two blade receptacles of an electrical wall outlet.

2. The improvement of claim 1, wherein said probe tips are spaced apart by approximately 0.5 inches center to center.

3. The improvement of claim 1, wherein said visual indicator is visible from sides of said indicator housing.

4. The improvement of claim 3, wherein a second visual indicator is provided on said top surface of said indicator housing, one of said visual indicators becoming illuminated when said magnitude of said voltage between said nodes is at one level and both of said indicators illuminating when said voltage is at a second level which is higher than said one level.

5. The improvement of claim 1 wherein said probe handles are snapped into said clip from opposite sides of said clip.

6. The improvement of claim 5 wherein said probes are held by said clip with a flat surface of each said probe against said bottom surface of said indicator housing.

7. The improvement of claim 6, wherein said flat surface of each said probe is formed on a flange of said probe which is forward of said handle of said probe.

* * * * *